(12) United States Patent
Riegel et al.

(10) Patent No.: US 9,373,819 B2
(45) Date of Patent: Jun. 21, 2016

(54) ORGANIC LIGHT-EMITTING DEVICE AND METHOD FOR PRODUCING AN ORGANIC LIGHT-EMITTING DEVICE

(71) Applicant: OSRAM Opto Semiconductors GmbH, Regensburg (DE)

(72) Inventors: Nina Riegel, Tegernheim (DE); Thilo Reusch, Donaustauf (DE); Daniel Steffen Setz, Boeblingen (DE)

(73) Assignee: OSRAM OLED GMBH, Regensburg (DE)

( * ) Notice: Subject to any disclaimer, the term of this patent is extended or adjusted under 35 U.S.C. 154(b) by 71 days.

(21) Appl. No.: 14/388,784

(22) PCT Filed: Mar. 19, 2013

(86) PCT No.: PCT/EP2013/055669
§ 371 (c)(1),
(2) Date: Sep. 26, 2014

(87) PCT Pub. No.: WO2013/143920
PCT Pub. Date: Oct. 3, 2013

(65) Prior Publication Data
US 2015/0053951 A1 Feb. 26, 2015

(30) Foreign Application Priority Data
Mar. 28, 2012 (DE) .................. 10 2012 204 934

(51) Int. Cl.
*H01L 29/08* (2006.01)
*H01L 51/52* (2006.01)
*H01L 51/00* (2006.01)

(52) U.S. Cl.
CPC ........ *H01L 51/5268* (2013.01); *H01L 51/0026* (2013.01); *H01L 51/5284* (2013.01); *H01L 51/5296* (2013.01); *H01L 51/0043* (2013.01)

(58) Field of Classification Search
CPC .................................................. H01L 51/5268
See application file for complete search history.

(56) References Cited

U.S. PATENT DOCUMENTS 7,232,637 B2 * 6/2007 Cole et al. ..................... 430/269
(Continued)

FOREIGN PATENT DOCUMENTS

CN  1665361 A  9/2005
(Continued)

OTHER PUBLICATIONS

"Mesostructured and Mesoporous Silicates", http://people.ccmr.cornell.edu/~uli/pages/aluminosilicates.html, pp. 1-2, visited on Jul. 30, 2014.
(Continued)

*Primary Examiner* — Cuong Q Nguyen
*Assistant Examiner* — Nishath Yasmeen
(74) *Attorney, Agent, or Firm* — McDermott Will & Emery LLP

(57) ABSTRACT

The invention relates to an organic light-emitting part having a functional layer stack (10), which functional layer stack has a substrate (1), a first electrode (2) above the substrate, an organic functional layer stack (4) above the first electrode, having an organic light-emitting layer (5), and a second electrode (3) above the organic functional layer stack, wherein a layer (1, 2, 3) of the functional layer stack (10) forms a carrier layer (6) for a diffusion layer (7), wherein the diffusion layer (7) has at least one first and one second organic component (71, 72) having indices of refraction that differ from each other, wherein the first organic component (71) is hydrophobic and the second organic component (72) is hydrophilic, wherein the glass transition temperature of a mixture of the first organic component (71) and the second organic component (72); lies above the room temperature and wherein the first organic component (71) and the second organic component (72) are partially segregated in the diffusion layer (7) and the diffusion layer (7) has a mesoscopic boundary layer (75) between the first and second organic components (71, 72) or the diffusion layer (7) is present as a mesophase (78) having the first and second organic component (71, 72). The invention further relates to a method for producing an organic light-emitting part.

15 Claims, 3 Drawing Sheets

(56) References Cited

U.S. PATENT DOCUMENTS

Figure 1:
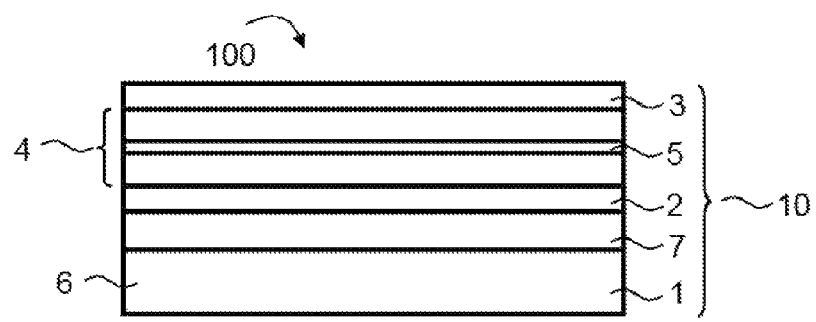

| | | | |
|---|---|---|---|
| 2005/0019602 A1 | 1/2005 | Sellinger | |
| 2005/0194896 A1* | 9/2005 | Sugita et al. | 313/506 |
| 2007/0254162 A1* | 11/2007 | Kozaki et al. | 428/426 |
| 2007/0257608 A1 | 11/2007 | Tyan et al. | |
| 2009/0236962 A1 | 9/2009 | Fujimoto et al. | |
| 2010/0112270 A1 | 5/2010 | Bulliard et al. | |
| 2010/0203235 A1* | 8/2010 | Verschuuren et al. | 427/66 |
| 2010/0258789 A1 | 10/2010 | Akai et al. | |
| 2010/0330716 A1 | 12/2010 | Tyan et al. | |
| 2012/0170253 A1* | 7/2012 | Park et al. | 362/97.1 |

FOREIGN PATENT DOCUMENTS

| | | |
|---|---|---|
| CN | 101060165 A | 10/2007 |
| EP | 1848050 A2 | 10/2007 |
| WO | 2009/004560 A2 | 1/2009 |
| WO | 2010/016763 A1 | 2/2010 |
| WO | 2010/066245 A1 | 6/2010 |
| WO | 2011/110869 A2 | 9/2011 |

OTHER PUBLICATIONS

Jain A. et al.: "Direct Access to Bicontinuous Skeletal Inorganic Plumber's Nightmare Networks from Block Copolymers", Angew. Chem. Int. Ed., vol. 44, 2005, pp. 1226-1229.

Jain A. et. al.: "Silica-Type Mesostructures from Block Copolymer Phases: Formation Mechanism and Generalization to the Dense Nanoparticle Regime", Macromolecules, vol. 37, No. 15, 2004, pp. 5665-5670.

Simon R. et al.: "Block Copolymer-Ceramic Hybrid Materials from Organically Modified Ceramic Precursors", Chemistry of Materials, Vo. 13, No. 10, 2001, pp. 3463-3486.

Sun, Y. et al.: "Enhanced light out-coupling of organic light-emitting devices using embedded low-index grids", Nature Photonics; vol. 2; Aug. 2008; pp. 483-487.

Templin M. et al.: "Organically modified aluminosilicate mesostructures from block copolymer phases", Science, vol. 278, No. 5344, 1997, pp. 1795-1798.

Ulrich R. et al.: "Nano-objects with controlled shape, size, and composition from block copolymer mesophases", Advanced Materials, vol. 11, No. 2, 1999, pp. 141-146.

Verploegen E. et al.: "Tuning Mechanical Properties of Block Copolymer-Aluminosilicate Hybrid Materials", Macromol. Rap. Comm., vol. 28, 2007, pp. 572-578.

* cited by examiner

ORGANIC LIGHT-EMITTING DEVICE AND METHOD FOR PRODUCING AN ORGANIC LIGHT-EMITTING DEVICE

An organic light-emitting device and a method for producing an organic light-emitting device are described.

In organic light-emitting diodes (OLEDs) only part of the generated light is outcoupled directly. The rest of the light generated in the active region is distributed among various loss channels, for instance in light which is absorbed in the substrate and in light which is guided in the substrate, in a transparent electrode and in organic layers by wave guidance effects, and in surface plasmons, which may be generated in a metallic electrode. The wave guidance effects arise in particular through the refractive index differences at the interfaces between the individual layers and regions of an OLED. With known OLEDs, typically only around a quarter of the light generated in the active region is outcoupled into the surrounding environment, i.e. for example the air, while around 25% of the generated light is lost to emission by wave guidance in the substrate, around 20% of the generated light by wave guidance in a transparent electrode and the organic layers and around 30% through the generation of surface plasmons in a metallic electrode. The light guided in the loss channels cannot be outcoupled from an OLED in particular without additional technical measures.

To increase light outcoupling and thus emitted light output, measures are known for outcoupling the light guided in a substrate into emitted light. To this end, films containing scattering particles or films with surface patterns such as for instance microlenses are used for example on the outside of the substrate. It is also known to provide direct patterning of the outside of the substrate or to introduce scattering particles into the substrate. Some of these approaches, for example the use of scattering films, are already used commercially and may be scaled up with regard to the emission surface in particular in OLEDS which take the form of lighting modules. However, these approaches to light outcoupling have the significant disadvantages that outcoupling efficiency is limited to around 60 to 70% of the light guided in the substrate and that the appearance of the OLED is affected substantially, since the applied layers or films produce a milky, diffusely reflective surface.

Approaches are also known which involve outcoupling light guided in organic layers or in a transparent electrode. However, these approaches have not so far gained commercial acceptance in OLED products. For example, the document Y. Sun, S. R. Forrest, Nature Photonics 2, 483 (2008) proposes forming "low-index grids", wherein patterned regions with a material of low refractive index are applied to a transparent electrode. It is moreover also known to apply high-refractive-index scattering regions under a transparent electrode in a polymer matrix, as described for example in document US 2007/0257608. Herein, the polymer matrix generally has a refractive index in the range of n=1.5 and is applied by a wet chemical method.

It is at least one object of specific embodiments to provide an organic light-emitting device which comprises improved efficiency and light outcoupling. It is at least one further object of specific embodiments to provide a method for producing an organic light-emitting device.

These objects are achieved by a subject matter and a method according to the independent claims. Advantageous embodiments and further developments of the subject matter and of the method are characterised in the dependent claims and are revealed, moreover, by the following description and drawings.

According to at least one embodiment, an organic light-emitting component comprises a functional layer stack which comprises a substrate, a first electrode thereabove and a second electrode above that. Between the first and second electrodes, i.e. above the first electrode and below the second electrode, the functional layer stack comprises an organic functional layer stack with an organic light-emitting layer. The phrase "organic functional layer stack" is used here and hereinafter to denote the entirety of the organic layers of the organic light-emitting component arranged between the electrodes, while the "functional layer stack" also comprises at least the electrodes and the substrate in addition to the organic functional layer stack. The organic light-emitting device may in particular be configured as an organic light-emitting diode (OLED) which comprises an electroluminescent layer as the organic light-emitting layer.

Furthermore, the organic light-emitting device comprises a scattering layer, which may in particular be suitable for increasing the outcoupling of light generated in the organic light-emitting layer, which light would for example otherwise be guided by wave guidance effects in layers of the functional layer stack. To this end, the functional layer stack comprises a carrier layer, on which the scattering layer is applied. The term "carrier layer" is used here and hereinafter to denote that layer of the functional layer stack on which the scattering layer is applied directly in the context of a method for producing the organic light-emitting device. The carrier layer may for example be formed by the substrate, the first electrode, an organic layer of the organic functional layer stack or the second electrode.

In particular, the layer formed as a carrier layer and the further layers of the functional layer stack, which are arranged on the side of the carrier layer remote from the organic light-emitting layer, are configured to be transparent. Here and hereinafter, "transparent" denotes the characteristics of a layer or an element of being at least in part light-transmissive. A transparent layer may therefore appear at least partly transparent or at least partly translucent, i.e. diffusely light-transmissive, for instance milky.

The organic functional layer stack may comprise layers with organic polymers, organic oligomers, organic monomers, organic small, non-polymeric molecules ("small molecules") or combinations thereof. It may in particular be advantageous for the organic functional layer stack to comprise an organic functional layer which takes the form of a hole-transport layer, in order to allow effective hole injection into the light-emitting layer. Materials which may prove advantageous for a hole-transport layer are for example tertiary amines, carbazole derivatives, conductive polyaniline or polyethylenedioxythiophene. Materials suitable for the organic light-emitting layer are materials which display radiation emission based on fluorescence or phosphorescence, for example polyfluorene, polythiophene or polyphenylene, or derivatives, compounds, mixtures or copolymers thereof. Furthermore, the organic functional layer stack may comprise a functional layer which is configured as an electron-transport layer. Moreover, the layer stack may also comprise electron- and/or hole-blocking layers. The organic functional layer stack may also comprise a plurality of organic light-emitting layers arranged between the electrodes.

With regard to the fundamental structure of an organic light-emitting component, for example with regard to the structure, the layer composition and the materials of the organic functional layer stack, reference is here made to document WO 2010/066245 A1, which is hereby explicitly included by reference in particular in relation to the structure, the layer composition and the materials of an organic light-emitting component.

The electrodes may in each case be of large-area construction. This allows large-area emission of the light generated in the organic light-emitting layer. "Large-area" may here mean that the organic light-emitting device and in particular the organic light-emitting layer has an area, particularly preferably a contiguous area, of greater than or equal to a few square millimeters, preferably greater than or equal to a square centimeter and particularly preferably greater than or equal to a square decimeter.

According to a further embodiment, the substrate comprises one or more materials in the form of a layer, a plate, a film or a laminate, which are selected from glass, quartz, plastics, metal or silicon wafer. The substrate particularly preferably comprises or consists of glass, for example in the form of a glass layer, glass film or glass sheet.

According to a further embodiment, the substrate and the first electrode are transparent, such that light generated in the light-emitting layer may be emitted by the transparent first electrode and the transparent substrate. Such an organic light-emitting device may also be described as a "bottom emitter". Alternatively, the second electrode may be transparent, such that light generated in the light-emitting layer may be emitted by the transparent second electrode. Such an organic light-emitting device may also be described as a "top emitter". Furthermore, it is also possible for both electrodes and the substrate to be transparent, such that the organic light-emitting device may be configured to emit bidirectionally, i.e. bilaterally and furthermore may be transparent or translucent. Depending on the desired emission direction, either the first electrode or the second electrode or both electrodes may thus take the form of transparent electrodes.

In the case of a bilaterally emitting organic light-emitting device, the functional layer stack may comprise at least one scattering layer on either side of the organic light-emitting layer.

According to a further embodiment, a transparent electrode comprises a transparent conductive oxide or consists of a transparent conductive oxide. Transparent conductive oxides (TCO) are transparent, conductive materials, generally metal oxides, such as for example zinc oxide, tin oxide, cadmium oxide, titanium oxide, indium oxide or indium tin oxide (ITO). In addition to binary metal-oxygen compounds, such as for example $ZnO$, $SnO_2$ or $In_2O_2$, ternary metal-oxygen compounds, such as for example $Zn_2SnO_4$, $CdSNO_3$, $ZnSnO_2$, $MgIn_2O_4$, $GaInO_2$, $Zn_2In_2O_5$ or $In_4Sn_3O_{22}$ or mixtures of different transparent conductive oxides also belong to the TCO group. Furthermore, TCOs do not necessarily correspond to a stoichiometric composition and may be also p- or n-doped.

Furthermore, a transparent electrode may comprise a metal layer or a metal film with a metal or an alloy, for example with one or more of the following materials: Ag, Pt, Au, Mg, Ag:Mg. For a transparent electrode, the metal layer or the metal film has such a small thickness that the metal layer or the metal film is at least in part light-transmissive.

According to a further embodiment, a transparent electrode comprises one or more of the above-stated materials in combination with a conductive polymer, for example poly-3, 4-ethylenedioxythiophene (PEDOT) and/or polyaniline (PANI), and/or with a transition metal oxide.

If just one of the first and second electrodes is transparent, the other electrode is preferably reflective and comprises for example a metal which may be selected from aluminium, barium, indium, silver, gold, magnesium, calcium and lithium and compounds, combinations and alloys thereof. In particular, the reflective electrode may comprise Ag, Al or alloys therewith, for example Ag:Mg, Ag:Ca, Mg:Al. Alternatively or in addition, the reflective electrode may also comprise one or more of the above-stated TCO materials.

According to a further embodiment, the organic light-emitting device comprises an encapsulation over the electrodes and the organic functional layer stack, for example in the form of a cover, for instance a glass cover or a glass substrate, and/or in the form of a thin-film encapsulation with one or a plurality of applied layers which each alone or through interaction offer protection to the organic functional layer stack and electrode from harmful substances in the surrounding environment such as for example oxygen and/or moisture.

According to a further embodiment, the scattering layer comprises at least one first organic component and one second organic component. The first and second organic components have refractive indices which differ from one another. Depending on the arrangement of the scattering layer in the functional layer stack, it may be advantageous for at least the first organic component or the second organic component or both organic components to be electrically conductive. In particular, the scattering layer may thereby be electrically conductive.

Furthermore, the first organic component is hydrophobic, while the second organic component is hydrophilic. To this end, the first organic component comprises an organic material, for example a polymer or a monomer, which is hydrophobic, while the second organic component comprises an organic material, for example a polymer or monomer, which is hydrophilic.

According to a further embodiment for producing the scattering layer, the first organic component and the second organic component are mixed and the mixture of the first and second organic components is applied to the carrier layer. For example, the components may be dissolved in an ambipolar solvent and thereby maximally intermixed. The mixture of the first and second organic components may thereby be applied to the carrier layer using a dissolution process. Alternatively, it is also possible for the components to be mixed without solvent, for example using ultrasound. The mixture of the first and second organic components may thus for example be a suspension in an emulsion or a pure emulsion.

The mixture of the first and second organic components has a glass transition temperature which is above room temperature. At temperatures below the glass transition temperature of the mixture, the first and second components are so to speak "frozen" in the mixture, while at temperatures above the glass transition temperature the degree of intermixing of the first and second components in the mixture can be influenced. In the scattering layer, the first and second organic components are partially segregated, i.e. neither completely intermixed nor completely segregated. Instead, the scattering layer comprises the first and second components in a partially intermixed state, wherein the scattering layer comprises a mesoscopic boundary layer between the first and second components or the scattering layer is present as a mesophase of the first and second components, as explained in greater detail further below.

According to a further embodiment, in a method for producing an organic light-emitting device a mixture of the first and second organic components is provided. In particular, the first and second organic components are provided in a mixture in the form of a solution with an ambipolar solvent. If the scattering layer, as described further below, comprises further materials such as for example a third component, these further materials are also provided in the mixture together with the first and second organic components. The mixture is additionally applied to the carrier layer and exposed to heat treatment at an elevated temperature above a glass transition temperature of the mixture.

According to a further embodiment, in a method for producing an organic light-emitting component the first component and the second component are partially intermixed to form a partial mixture. Particularly preferably, partial intermixing may be brought about by ultrasonication. During formation of the partial mixture of the first and second components, the latter are exposed to heat treatment at an elevated temperature above a glass transition temperature of the mixture. The partial mixture is applied to the carrier layer.

The embodiments and features described above and hereinafter apply equally to the organic light-emitting device and to the method for producing the organic light-emitting device.

According to a further embodiment, to produce the organic light-emitting device at least the substrate is provided, on which further layers of the functional layer stack may be applied until the layer provided as a carrier layer is arranged at the top. The mixture for forming the scattering layer is then applied thereto. After formation of the scattering layer, as described further below, the further layers of the functional layer stack, which are needed to finish the organic light-emitting device, are applied to the scattering layer.

According to a further embodiment, the substrate of the functional layer stack is configured as a carrier layer and the mixture is applied directly to the substrate. After completion of the scattering layer, the first electrode is applied thereabove, preferably consisting of a transparent conductive oxide such as for example ITO which may be applied using a sputtering process. The further layers of the functional layer stack are applied thereabove.

According to a further embodiment, the first electrode is configured as a carrier layer and the mixture of the first and second organic components is applied directly to the first electrode. After completion of the scattering layer, the organic functional layers of the organic functional layer stack are applied, together with the second electrode.

According to a further embodiment, one of the organic functional layers of the organic functional layer stack is configured as the carrier layer, such that the mixture of the first and second organic components is applied in one method step after application of an organic functional layer and before application of a further organic functional layer or of the second electrode. After completion of the scattering layer, the further organic functional layers and the second electrode are applied. If the carrier layer is the organic functional layer arranged on the top of the organic functional layer stack, the second electrode is applied directly to the scattering layer.

According to a further embodiment, the second electrode is configured as a carrier layer, such that the mixture of the first and second organic components is applied to the substrate after application of the electrodes and the organic functional layer stack arranged therebetween.

According to a further embodiment, one of the following methods is selected as the application method for applying the mixture of the first and second organic components to the carrier layer, depending on the viscosity of the mixture: gravure printing, flexographic printing, knife coating, slot coating or spray coating. Gravure printing or flexographic printing in particular are particularly preferably suitable if the scattering layer forms the first layer of the organic functional layer stack on the first electrode.

According to a further embodiment, the mixture is provided with an ambipolar solvent and applied to the carrier layer. Furthermore, after application the applied mixture is exposed to a heat treatment at an elevated temperature above the glass transition temperature of the mixture. The temperature is here selected in such a way that the first and second organic components partially segregate due to their opposing polar properties. This segregation is designated here and hereinafter also as phase separation. Depending on the polar property of the carrier layer on which the mixture is applied, thus depending on whether the carrier layer is hydrophobic or hydrophilic or has been modified accordingly by pretreatment of its surface, the first organic component or the second organic component will arrange itself according to its polar or nonpolar property on the identically polar carrier layer, while the component of the opposite polar configuration to the carrier layer will in the course of segregation arrange itself away from the boundary surface on the surface of the mixture layer remote from the carrier layer. Thus, through this surface-induced process resulting from segregation, the oppositely polar component is pushed away from the carrier layer in the course of segregation. If further components which are hydrophobic or hydrophilic are present in the mixture, these will preferentially accumulate over the course of segregation in the identically polar component.

"Identically polar" here and hereinafter means two layers or materials which are both either hydrophobic or hydrophilic, while "oppositely polar" means two materials or layers, one of which is hydrophobic and the other of which is hydrophilic.

According to a further embodiment, the heat treatment is terminated by cooling before ordering of the first and second organic component is complete, i.e. before the first and second organic components have segregated completely and a clear boundary surface has formed between the components. In other words, the mixture is not kept at the elevated temperature until the first and second organic components have completely accumulated into two separate phases. Instead, the phase separation of the two components which begins during heat treatment and during which a solvent present in the mixture also begins to vaporise, is interrupted again by cooling.

This ensures that complete segregation of the first and second organic components does not take place, such that gradients arise, in particular in the lateral direction, i.e. along the main direction of extension of the layers of the functional layer stack. The result is a "fuzzy" boundary layer, which is designated a mesoscopic boundary layer. The mesoscopic boundary layer is distinguished in particular by an irregular arrangement of the first and second organic components, such that boundary surface scattering may arise in the mesoscopic boundary layer during subsequent operation of the organic light-emitting device due to the different refractive indices of the first and second organic components.

In particular, an irregularly oriented boundary surface may be present in the mesoscopic boundary layer between the first organic component and the second organic component. The irregularly oriented boundary surface may here differ in terms of its profile in particular from the direction of layer extension of the other layers of the functional layer stack. The mixture of the first and second organic components and process control, i.e. for example the elevated temperature and duration of heat treatment, are preferably selected during the segregation phase in such a way that the mesoscopic boundary layer has a thickness of greater than or equal to 0.5 µm and less than or equal to 100 µm.

As a result of the interrupted phase separation, the first and second organic components are present in each case in a sublayer, wherein one of the first and second organic components is in each case predominantly present in each of the sublayers. This may also mean that the second organic component is still present here and there in the first sublayer formed for example by the first organic component and vice versa. Thus, the two sublayers may in each case still display partial intermixing of the first and second organic components, wherein one of the two components is predominantly present in each of the sublayers. The sublayers are here separated by the irregularly extending boundary surface in the mesoscopic boundary layer.

According to a further embodiment, the carrier layer is of ambipolar configuration. In this case, application of the mixture of the dissolved first and second organic components does not result in surface-induced partial segregation but rather the first and second organic components segregate spontaneously locally so forming droplets at least of the first organic component in the second organic component or vice versa. Furthermore, in particular in the case of a mixture of the first and second organic components in which components are present at least locally in approximately identical amounts, droplet formation may also arise in both components. The term "droplets" is used here and hereinafter to denote a region which comprises just one of the first and second organic components and is clearly delimited from the component not contained therein. In the case of droplet formation, the scattering layer is present in a mesophase, in which the droplets form scattering centres for "subsurface scattering".

Segregation of the first and second organic components may preferably be effected to the extent that the droplets have a size of greater than or equal to 200 nm and less than or equal to 10 μm.

According to a further embodiment, the first and second organic components are intermixed without solvent for example by ultrasonication and exposed to an elevated temperature above the glass transition temperature, whereby partial intermixing of the first and second components is achieved. The heat treatment is preferably terminated before intermixing of the first and second components is complete by cooling the mixture to below the glass transition temperature. This also makes it possible for the first and second organic components to be present in the mixture then applied to the carrier layer and thus in the scattering layer in an above-described mesophase with droplet formation.

According to a further embodiment, the first and second organic components form a block copolymer, which is thus formed of two components with different refractive indices and opposing polar properties. To produce the scattering layer, block copolymers may be applied to the carrier layer for example in solution. Furthermore, it may also be possible for the block copolymers, as described above for the mixture of the first and second organic components, to be subjected to heat treatment.

The term "block copolymers" is used here and hereinafter to denote not only diblock copolymers with the basic structure A-B but also triblock copolymers with the basic structure A-B-A and A-B-C and correspondingly higher-order block structures, for example with the basic structure A-B-C-B-A or (-A-B-)$_n$, (n>1) and variations thereof, wherein A, B and C identify organic components, of which one is the first and one the second organic component. Furthermore, other linear or branched block copolymers are also possible, for example with the following basic structure:
-A-B-A-B-A-B-A-B-,
-A-A-B-A-B-B-B-A-,
-A-A-A-A-B-B-B-B-,
-A-A(-B)-A-,
-A-A(-B-B-B)-A-A-A(-B-B-B)-A-A-A-.

The "X(-Y)-Z" pattern here represents branches from component X. Component X is here attached to the two branches formed by component Y and component Z.

Due to their chemical structure with the first and second organic components, block copolymers have a tendency towards phase separation. Depending on the length of the individual blocks, the composition of the blocks, the block sequence and the processing conditions, such as for instance temperature, casting and shear forces, a two- or three-dimensional structure may arise through the arrangement of the block copolymers in a self-assembly process. For example, micelles, for instance spherical or cylindrical micelles, vesicles, linear regions, branched regions, layer arrangements or combinations thereof may be formed by the first and second components of the block copolymers. As described above for a mixture of the first and second organic components, in the case also of the block copolymers described here a mesoscopic boundary layer or one or more mesophases may form and consequently refractive index gradients, which result from the partially unordered arrangement of the block copolymers. Thus, a scattering layer formed by block copolymers may result in boundary surface scattering and/or subsurface scattering when the organic light-emitting component is in operation.

Furthermore, the block copolymer may also comprise a component, for example the first or second organic component, which may undergo still further reactions after the self-assembly process. For example, in the case of a block copolymer with the components or blocks A and B, component A may comprise or consist of a crosslinking component and component B a thermally labile polymer unit. By heating the self-assembled layer with such block copolymers to above the decomposition temperature of component B, bubbles of a defined size may be produced. In this case, thermally stable polymer blocks, for instance polyimides, polybenzoxazoles, polyetherether ketones and/or polysulfones, are preferably used for component A, while component B is formed by a pore-forming component, for example polypropylene glycols.

Furthermore, block copolymers may also be formed by systems which also comprise intercalated inorganic nanoparticulate systems in addition to purely organic components. For example, an amphiphilic diblock copolymer, for example poly(isoprene-block-ethylene oxide) (PI-b-PEO), may be provided in order to bring about a structured arrangement of aluminosilicate-like nanoparticles. The nanoparticles may be produced in a sol-gel process, wherein organically modified silicon alkoxide and an aluminium alkoxide are mixed with water. By mixing with PI-b-PEO, ordered mesostructures or mesophases may be produced with regions with the hydrophobic component PI and the hydrophilic components PEO and aluminosilicate. By varying the added quantity of aluminosilicate-like nanoparticles, a further region of different morphologies or structures may be produced, for example spherical regions in a bcc-like lattice ("bcc spheres"), hexagonally arranged cylinders ("hexagonally packed cylinders"), a cubic bicontinuous arrangement ("inverse plumber's nightmare"), lamellae, a gyroid structure ("gyroid"), inverse hexagonal cylinders or spherical regions in an inverse bcc-like lattice ("inverse bcc spheres"), wherein the stated structures are listed in a sequence with increasing proportions of the aluminosilicate-like nanoparticles. "Hairy" nanostructures for example in the form of spheres, cylinders or lamellae may be produced by dissolving the structures. Through exposure to heat, the organic components may also be decomposed, whereby mesostructured aluminosilicate ceramic materials are obtained.

According to a further embodiment, the block copolymer with the first and second organic components comprises an anchor group with a preselected reactivity or polarity. The anchor group is thus for example preferably hydrophobic or hydrophilic. For example, a reactive anchor group may be formed from a sulfide or a carboxylate. Depending on the configuration or pretreatment of the carrier layer, the block copolymers align, wherein, if present, the anchor groups may attach themselves to the carrier layer or bind thereto, while the other end projects in a more or less ordered way onto the surface of the layer formed from the block copolymers.

According to a further embodiment, the refractive index difference of the first and second organic components is greater than 0.05. This may result in effective boundary surface scattering in the mesoscopic boundary layer between the two organic components or in effective subsurface scattering in a mesophase of the two organic components.

The first and second organic components may for example in each case comprise one of the following high-refractive-index or low-refractive-index organic materials. In particular, the materials stated below may also form components, i.e. the first and/or second organic components, of a block copolymer.

The following materials may be considered as high-refractive-index materials:
poly(1-naphthyl methacrylate),
poly(2,4,6-tribromophenyl methacrylate),
poly(2,4,6-tribromophenyl methacrylate-co-glycidyl methacrylate) [glycidyl methacrylate 10 mol %],
poly(2,6-dichlorostyrene),
poly(2,6-dichlorostyrene-co-glycidyl methacrylate) [glycidyl methacrylate 10 mol %],
poly(2-chlorostyrene), poly(2-vinylthiophene),
poly(N-vinylphthalimide),
poly(pentabromobenzyl acrylate),
poly(pentabromobenzyl methacrylate),
poly(pentabromobenzyl methacrylate-co-glycidyl methacrylate) [glycidyl methacrylate 10 mol %],
poly(pentabromophenyl acrylate),
poly(pentabromophenyl acrylate-co-glycidyl methacrylate) [glycidyl methacrylate 10 mol %],
poly(pentabromophenyl acrylate-co-glycidyl methacrylate) [glycidyl methacrylate 50 mol %],
poly(pentabromophenyl methacrylate),
poly(pentabromophenyl methacrylate-co-glycidyl methacrylate) [glycidyl methacrylate 10 mol %],
poly(pentabromophenyl methacrylate-co-glycidyl methacrylate) [glycidyl methacrylate 50 mol %],
poly(pentachlorophenyl methacrylate),
poly(pentachlorophenyl methacrylate-co-glycidyl methacrylate) [glycidyl methacrylate 10 mol %],
poly(vinyl phenyl sulfide),
poly(vinyl phenyl sulfide-co-glycidyl methacrylate) [glycidyl methacrylate 10 Mol %].

The following materials may be considered as low-refractive-index materials:
poly(1,1,1,3,3,3-hexafluoroisopropyl acrylate),
poly(1,1,1,3,3,3-hexafluoroisopropyl methacrylate),
poly(1,1,1,3,3,3-hexafluoroisopropyl methacrylate-co-glycidyl methacrylate) [glycidyl methacrylate 10 mol %],
poly(2,2,2-trifluoroethyl acrylate),
poly(2,2,2-trifluoroethyl methacrylate),
poly(2,2,2-trifluoroethyl methacrylate-co-glycidyl methacrylate) [glycidyl methacrylate 10 mol %],
poly(2,2,2-trifluoroethyl methacrylate-co-glycidyl methacrylate) [glycidyl methacrylate 50 mol %],
poly(2,2,3,3,3-pentafluoropropyl acrylate),
poly(2,2,3,3,3-pentafluoropropyl methacrylate),
poly(2,2,3,3,3-pentafluoropropyl methacrylate-co-glycidyl methacrylate) [glycidyl methacrylate 50 mol %],
poly(2,2,3,3,4,4,4-heptafluorobutyl acrylate),
poly(2,2,3,3,4,4,4-heptafluorobutyl methacrylate),
poly(2,2,3,3,4,4,4-heptafluorobutyl methacrylate-co-glycidyl methacrylate) [glycidyl methacrylate 10 mol %],
poly(2,2,3,3,4,4,4-heptafluorobutyl methacrylate-co-glycidyl methacrylate) [glycidyl methacrylate 50 mol %],
poly(2,2,3,3-tetrafluoropropyl acrylate),
poly(2,2,3,3-tetrafluoropropyl methacrylate),
poly(2,2,3,3-tetrafluoropropyl methacrylate-co-glycidyl methacrylate) [glycidyl methacrylate 10 mol %],
poly(2,2,3,3-tetrafluoropropyl methacrylate-co-glycidyl methacrylate) [glycidyl methacrylate 50 mol %],
poly(2,2,3,4,4,4,-hexafluorobutyl methacrylate-co-glycidyl methacrylate) [glycidyl methacrylate 10 mol %],
poly(2,2,3,4,4,4,-hexafluorobutyl methacrylate-co-glycidyl methacrylate) [glycidyl methacrylate 10 mol %],
poly(2,2,3,4,4,4-hexafluorobutyl acrylate),
poly(2,2,3,4,4,4-hexafluorobutyl methacrylate),
poly(pentafluorostyrene),
poly(pentafluorostyrene-co-glycidyl methacrylate) [glycidyl methacrylate 10 mol %],
poly(pentafluorostyrene-co-glycidyl methacrylate) [glycidyl methacrylate 30 mol %],
poly(pentafluorostyrene-co-glycidyl methacrylate) [glycidyl methacrylate 50 mol %],
poly(tert-butyl methacrylate-co-glycidyl methacrylate) [glycidyl methacrylate 50 mol %],
poly[4,5-difluoro-2,2-bis(trifluoromethyl)-1,3-dioxole-co-tetrafluoroethylene][dioxole 65 mol %],
poly[4,5-difluoro-2,2-bis(trifluoromethyl)-1,3-dioxole-co-tetrafluoroethylene][dioxole 87 mol %].

Refractive index differences of up to 0.3 may be achieved with the stated organic materials, whereby an effective scattering layer may be obtained.

Furthermore, the first and second organic components may also form the scattering layer by non-covalent synthesis strategies. Examples which may be mentioned here are interaction of ionic components or coordinative interaction.

In the case of an electrically conductive scattering layer, in particular in the case of an electrically conductive scattering layer for a "bottom emitter", which is applied to an electrode formed from a TCO such as for instance indium tin oxide, the first and/or second organic components may also be formed by monomers, polymers or by blocks for block copolymers which are based on one or more of the following hole-conducting materials, which may also be doped:
N,N'-bis(naphthalen-1-yl)-N,N'-bis(phenyl)-9,9-dimethylfluorene,
N,N'-bis(3-methylphenyl)-N,N'-bis(phenyl)-9,9-diphenylfluorene,
N,N'-bis(naphthalen-1-yl)-N,N'-bis(phenyl)-9,9-diphenylfluorene,
N,N'-bis(naphthalen-1-yl)-N,N'-bis(phenyl)-2,2-dimethylbenzidine,
N,N'-bis(3-methylphenyl)-N,N'-bis(phenyl)-9,9-spirobifluorene,
2,2',7,7'-tetrakis(N,N-diphenylamino)-9,9'-spirobifluorene,
N,N'-bis(naphthalen-1-yl)-N,N'-bis(phenyl)-benzidine,
N,N'-bis(naphthalen-2-yl)-N,N'-bis(phenyl)benzidine,
N,N'-bis(3-methylphenyl)-N,N'-bis-(phenyl)-benzidine,
N,N'-bis(3-methylphenyl)-N,N'-bis(phenyl)-9,9-dimethylfluorene,
N,N'-bis(naphthalen-1-yl)-N,N'-bis(phenyl)-9,9-spirobifluorene, di-[4-(N,N-ditolylamino)phenyl]cyclohexane,
2,2',7,7'-tetra(N,N-di-tolyl)aminospirobifluorene,
9,9-bis[4-(N,N-bis-biphenyl-4-ylamino)phenyl]-9H-fluorene,
2,2',7,7'-tetrakis[N-naphthalenyl(phenyl)-amino]-9,9-spirobifluorene,
2,7-bis[N,N-bis(9,9-spirobifluoren-2-yl)-amino]-9,9-spirobifluorene,
2,2'-bis[N,N-bis(biphenyl-4-yl)amino]-9,9-spirobifluorene,
N,N'-bis(phenanthren-9-yl)-N,N'-bis(phenyl)-benzidine,
N,N,N',N'-tetranaphthalen-2-ylbenzidine,
2,2'-bis(N,N-di-phenylamino)-9,9-spirobifluorene,
9,9-bis[4-(N,N-bis-naphthalen-2-ylamino)phenyl]-9H-fluorene,
9,9-bis[4-(N,N'-bis-naphthalen-2-yl-N,N'-bis-phenylamino)phenyl]-9H-fluorene, titanium oxide phthalocyanine,
copper phthalocyanine,
2,3,5,6-tetrafluoro-7,7,8,8-tetracyanoquinodimethane,
4,4',4''-tris(N-3-methylphenyl-N-phenylamino)triphenylamine,
4,4',4''-tris(N-(2-naphthyl)-N-phenylamino)triphenylamine,
4,4',4''-tris(N-(1-naphthyl)-N-phenylamino)triphenylamine,
4,4',4''-tris(N,N-diphenylamino)triphenylamine, pyrazino[2,3-f][1,10]phenanthroline-2,3-dicarbonitrile,
N,N,N',N'-tetrakis(4-methoxyphenyl)benzidine,
2,7-bis[N,N-bis(4-methoxyphenyl)amino]-9,9-spirobifluorene,
2,2'-bis[N,N-bis(4-methoxyphenyl)amino]-9,9-spirobifluorene,
N,N'-di(naphthalen-2-yl)-N,N'-diphenylbenzene-1,4-diamine,
N,N'-di-phenyl-N,N'-di-[4-(N,N-di-tolylamino)phenyl]-benzidine,
N,N'-di-phenyl-N,N'-di-[4-(N,N-di-phenylamino)phenyl]-benzidine.

The hole-transport layer arranged thereabove may then preferably comprise monomers based on triarylamines or thiophenones.

For an inverted "top emitter" the same applies for the electron-transport layers, which are preferably formed of doped or undoped heteroaromatics.

According to a further embodiment, the scattering layer comprises a sublayer remote from the carrier layer with the predominantly present first organic component or the predominantly present second organic component. The sublayer remote from the carrier layer particularly preferably has a refractive index which is substantially equal to the refractive index of a layer of the functional layer stack which is directly adjacent the carrier layer. Through such "refractive index matching" wave guidance effects which could be caused by a refractive index difference at the boundary surface between the scattering layer and the directly adjacent layer, located thereabove, of the functional layer stack may be prevented. In other words, the organic component of the scattering layer arranged remote from the carrier layer may have a refractive index which, on arrangement of the scattering layer directly on the substrate, is adapted to the refractive index of the first electrode and, on arrangement of the scattering layer on the first electrode or within the organic functional layer stack, is adapted to a refractive index of an organic functional layer arranged directly thereabove.

According to a further embodiment, the scattering layer comprises a third component which is hydrophobic and has a refractive index different from the first organic component or which is hydrophilic and has a refractive index different from the second organic component. In particular, the third component is arranged at least predominantly in the organic component with the same polarity. To produce a scattering layer which additionally comprises the third component, the third component is provided in a mixture together with the first and second organic components, as described above. Because the third component and one of the first and second organic components are of identical polarity, the third component accumulates in this organic component during mixing or during segregation, depending on the method used to produce the scattering layer. As already described for the first and second organic components, segregation does not have to involve complete segregation of the third component from the organic component of opposite polarity.

The third component may preferably be formed by scattering particles. The scattering particles may for example be spherical in shape. Furthermore, other shapes are also possible for the scattering particles, which may for example lead to an anisotropic scattering effect. The scattering particles comprise for example aluminium oxide, titanium oxide, zirconium oxide, silicon oxide and/or glass particles or consist thereof. The scattering particles may be of a size, i.e. in particular dimensions such as for instance diameter, of greater than or equal to 200 nm, preferably greater than or equal 500 nm, and of less than or equal to 10 µm, preferably less than or equal to 5 µm and particularly preferably less than or equal to 3 µm.

According to a further embodiment, the scattering layer comprises at least one UV-absorptive additive. In this way, the organic layers of the organic functional layer stack may be protected from UV radiation. The additive may to this end comprise for example titanium dioxide or an organic UV radiation-absorbing material, for example one or more of the following materials: 2-hydroxybenzophenone, 2-hydroxyphenylbenzotriazole, salicylic acid esters, cinnamic acid ester derivative, resorcinol monobenzoate, oxalic acid anilide or p-hydroxybenzoic acid esters.

According to a further embodiment, at least one of the first and second organic components comprises a crosslinkable group, which may in particular be selected from an epoxide, an oxetane and/or an acrylate. In particular, the organic component of the scattering layer which is arranged directly adjacent the carrier layer may comprise the crosslinkable group. On production of the scattering layer, a free-radical or cationic initiator may preferably be added to the mixture with the first and second organic components, which initiator is capable of setting a chain reaction of the crosslinkable group in motion. Crosslinking may proceed thermally or optically during or after phase separation, i.e. the above-described heat treatment. If crosslinking takes place after phase separation, the structure of the scattering layer obtained during heat treatment may be "frozen" with the mesoscopic boundary layer or the mesophase, it then no longer being possible to modify said structure during operation of the organic light-emitting device. If crosslinking is started during the heat treatment and thus during phase separation or during intermixing, depending on the scattering layer production process, formation of the mesoscopic boundary layer or the mesophase may be purposefully controlled. In particular, it is possible to ensure that complete phase separation and complete intermixing is not achieved and the partial segregation or mixing is so to speak "frozen" by the viscosity of the mixture, which increases during crosslinking, or of the component to be crosslinked.

With the organic light-emitting device described here, an increase in efficiency and luminance homogenisation compared with OLEDs without such an additional scattering layer may be achieved by the scattering layer according to the previously described embodiments.

Application of the mixture with the first and second organic components may in particular proceed as described above in just one process step to produce an optionally conductive, outcoupling-improving scattering layer. The outcoupling-improving scattering layer may here also be located between the first and second electrodes and for example also within the organic functional layer stack, preferably in the direct vicinity of one of the electrodes. Scattering layers at these positions in the organic light-emitting device are suitable for outcoupling light generated in the organic light-emitting layer out of the organic light-emitting device better than from a conventional OLED device. It is here possible, preferably in a single process step, to achieve a combination of refractive index modulation and internal scattering. The scattering layer may in particular be produced with a laterally variable refractive index and furthermore also with a lateral gradient of scattering particles.

Through variable surface treatment of the carrier layer, a large bandwidth of materials is available which may be selected as the first and second organic components for the scattering layer, and therefore adjustment of the refractive indices and of the electrical behaviour of the scattering layer may proceed with high variability. The phase separation achieved during heat treatment and the resultant structure, in particular the mesoscopic boundary layer, is maintained during operation of the organic light-emitting device, since at normal operating temperature the glass transition temperature of the materials of the scattering layer is not exceeded. Using the duration of the heat treatment for phase separation, the degree of segregation of the first and second organic components and thus also the electrical and optical properties thereof may be purposefully selected. The same also applies to production of a mesophase in the mixture and thus in the scattering layer. Through suitable material selection, an improvement in the injection of charge carriers into the organic functional active layers of the organic light-emitting component may be achieved.

Figure 2A:
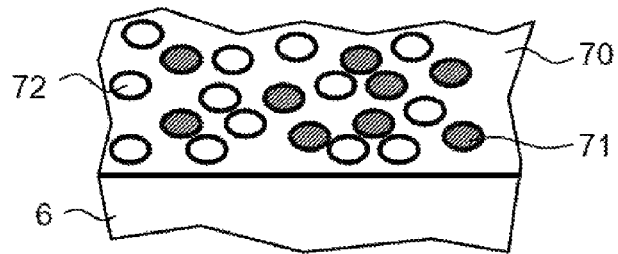
Figure 2B:
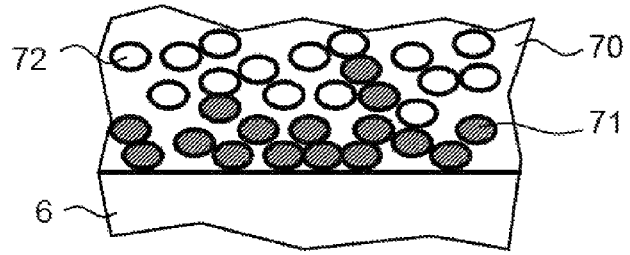
Figure 2C:
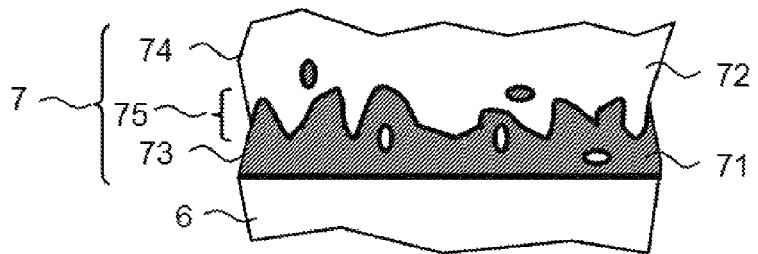
Figure 3:
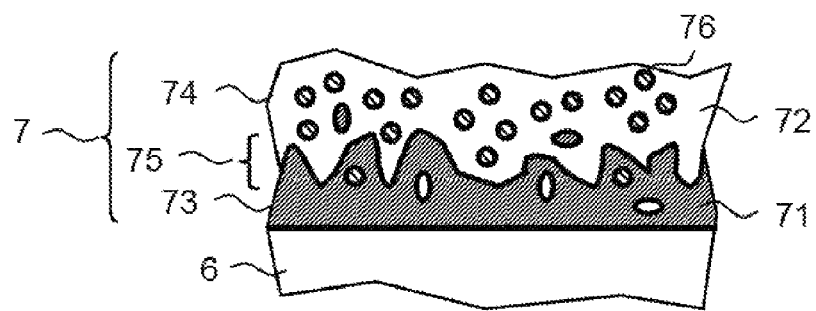
Figure 4:
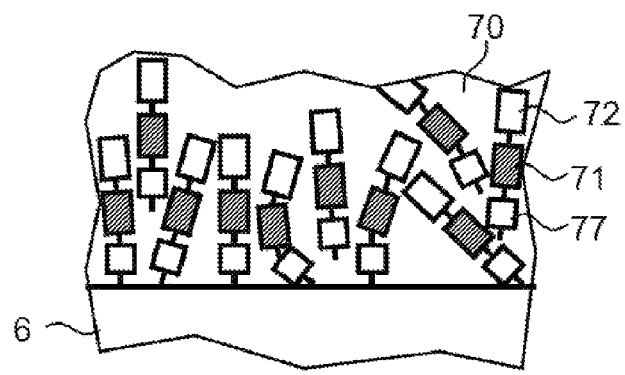
Figure 5:
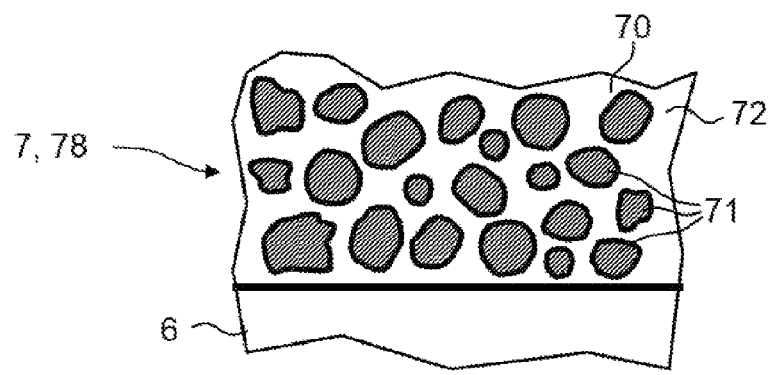
Figure 6:
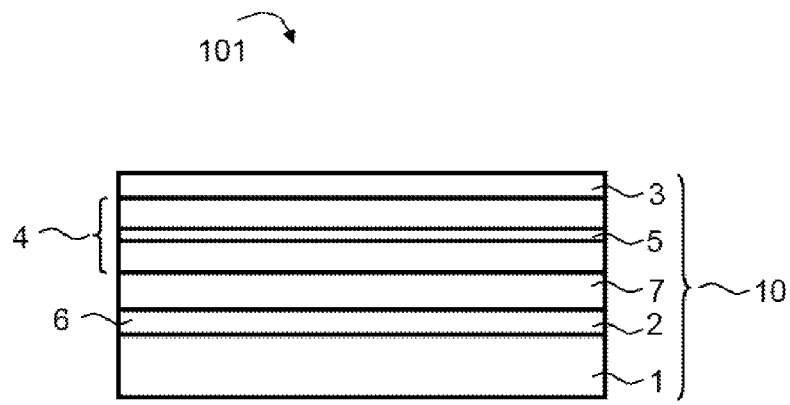
Figure 7:
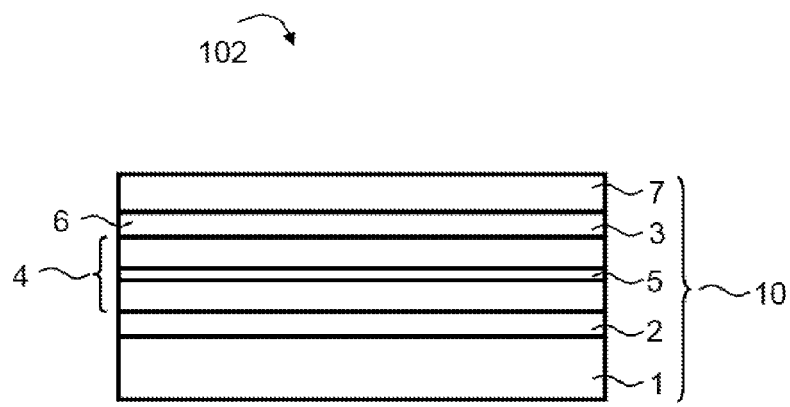
Figure 8:
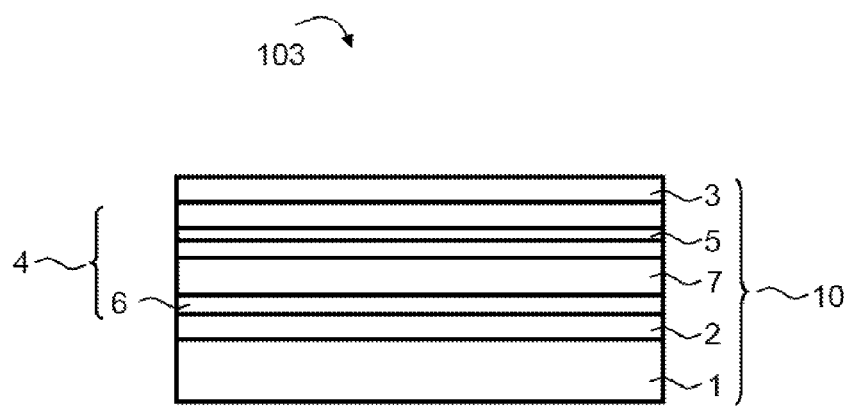

Further advantages, advantageous embodiments and further developments are revealed by the following exemplary embodiments described below in association with the figures, in which:

FIG. 1 is a schematic representation of an organic light-emitting device according to one exemplary embodiment, FIGS. 2A to 2C are schematic representations of method steps of a method for producing an organic light-emitting device according to a further exemplary embodiment, FIG. 3 is a schematic representation of a portion of an organic light-emitting device according to a further exemplary embodiment, FIG. 4 is a schematic representation of a method step of a method for producing an organic light-emitting device according to a further exemplary embodiment, FIG. 5 is a schematic representation of a portion of an organic light-emitting device according to a further exemplary embodiment and FIGS. 6 to 8 are schematic representations of organic light-emitting devices according to further exemplary embodiments.

In the exemplary embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

FIG. 1 shows an exemplary embodiment of an organic light-emitting device 100 comprising a functional layer stack 10.

The functional layer stack 10 comprises a substrate 1, on which an organic functional layer stack 4 is arranged between a first electrode 2 and a second electrode 3. The organic functional layer stack 4 comprises an organic light-emitting layer 5.

In the exemplary embodiment shown, the substrate 1 is transparent, for example in the form of a glass sheet or glass layer. Above this the first electrode 2 is applied, which for example comprises a transparent conductive oxide such as for instance ITO or another material stated above in the general part of the description for a transparent electrode. In the exemplary embodiment shown, the organic light-emitting device 100 thus takes the form of a bottom emitter and when in operation emits light through the first transparent electrode 2 and the transparent substrate 1.

The second electrode 3 is reflective in the exemplary embodiment of FIG. 1 and in particular comprises a metal stated above in the general part of the description. In particular, the first electrode 2 may take the form of an anode and the second electrode 3 the form of a cathode or vice versa.

The organic functional layer stack 4 with the organic light-emitting layer 5 comprises for example a hole-injection layer, a hole-transport layer, an electron-blocking layer, a hole-blocking layer, an electron-transport layer and/or an electron-injection layer, which are suitable for conducting holes and electrons to the organic light-emitting layer 5 or blocking the respective transport. Suitable layer structures for the organic functional layer stack 4 are known to a person skilled in the art and are therefore not explained further here.

The functional layer stack 10 further comprises a scattering layer 7, which is arranged on a carrier layer 6. In the exemplary embodiment shown in FIG. 1, the carrier layer 6 is formed by the substrate 1. The scattering layer 7 comprises a first organic component and a second organic component with different refractive indices, present in two sublayers, in which in each case one of the first and second organic components is predominantly present.

The structure and method for producing the organic light-emitting device, in particular with regard to the scattering layer 7, is described in association with FIGS. 2A to 2C, which in particular show a portion of the carrier layer 6, which may be formed according to the exemplary embodiment of FIG. 1 for example by the substrate 1.

In a first method step, the carrier layer 6, optionally having one or more further layers on which the carrier layer 6 is applied, is provided.

In a further method step, a mixture 70 with a first organic component 71 and a second organic component 72 is provided after provision of the carrier layer 6. The first organic component is here hydrophobic, while the second organic component 72 is hydrophilic. The components are dissolved, for example using a ambipolar solvent, and mixed thereby. The resultant mixture 70, which may be present as a suspension in an emulsion or as a pure emulsion, is applied to the carrier layer 6 using a dissolution process, as shown in FIG. 2A. Depending on the viscosity of the mixture 70 and the formation of the carrier layer 6, application methods which may be considered are in particular gravure printing, flexographic printing, knife coating, slot coating or spray coating.

The carrier layer 6, i.e. according to the exemplary embodiment of FIG. 1 for example the substrate 1, is purely by way of example hydrophobic. This may mean that the material of the carrier layer 6 is itself hydrophobic or that prior to application of the mixture 70 the surface of the carrier layer 6 is appropriately pretreated, such that said layer displays hydrophobic properties. As an alternative to the exemplary embodiment shown, the surface of the carrier layer 6 may also be hydrophilic, wherein in this case the direction of arrangement of the first and second organic components 71, 72 according to the following description is reversed.

In a further method step according to FIG. 2B, after application to the carrier layer 6 the mixture is subjected to a heat treatment at an elevated temperature, wherein the elevated temperature is above the glass transition temperature of the mixture of the first and second organic components 71, 72. During the heat treatment at least partial phase separation of components 71, 72 of the mixture 70 takes place. In accordance with the described formation or pretreatment of the carrier layer 6 with a hydrophobic surface, the component of identical polarity, i.e. in the exemplary embodiment shown the first organic component 71, preferably arranges itself close to the carrier layer 6. As a result of the temperature rise during the heat treatment, the solvent of the mixture 70 also begins to vaporise. The component of opposite polarity, i.e. in the exemplary embodiment shown the second organic component 72, is driven, over the course of segregation, away from the carrier layer 6 towards the surface of the layer formed by the mixture 70.

In a further method step, as shown in FIG. 2C, after partial segregation of the first and second organic components 71, 72 by the described surface-induced process the heat treatment is interrupted by cooling, so as to stop the phase separation. This results in a first sublayer 73, in which the first organic component is predominantly present, and a second sublayer 74, in which the second organic component is predominantly present. As is apparent from FIG. 2C, complete segregation is not preferred, such that the two sublayers 73, 74 may also to a certain extent still comprise the respective other organic component 71, 72.

The scattering layer 7 formed in this way comprises a mesoscopic boundary layer 75, which preferably comprises a fuzzy or irregular boundary surface between the first and second organic components 71, 72, i.e. between the two sublayers 73, 74. The boundary surface extends in the mesoscopic boundary layer in particular irregularly in various directions, which differ from the main direction of extension of the layers of the functional layer stack 10. This results, in the mesoscopic boundary layer 75, in the formation of refractive index gradients, in particular a laterally variable refractive index, resulting in the desired boundary surface scattering during operation of the organic light-emitting device 100. The refractive index difference between the refractive indices of the first and second organic components is preferably greater than 0.05. The mixture 70 and process control during heat treatment are selected such that the mesoscopic boundary layer has a thickness of between 0.5 µm and 100 µm, the limit values in each case being included.

The second organic component 72 in the exemplary embodiment shown and in general that organic component of the mixture 70 which is formed on the side of the scattering layer 7 remote from the carrier layer 6 is preferably selected in such a way that it has a refractive index which corresponds to the refractive index of the layer of the functional layer stack 10 which is located thereabove directly adjacent to the scattering layer 7. In the exemplary embodiment shown, this means adapting the refractive index of the second organic component 72 to the refractive index of the first electrode 2.

It may furthermore be possible for that organic component which forms the sublayer of the scattering layer 7 facing the carrier layer 6, i.e. the first organic component 71 in the exemplary embodiment shown, to be modified in such a way that it comprises a crosslinkable group. The crosslinkable group may be formed for example by an epoxide, oxetane and/or acrylate. A free-radical or cationic initiator is added to the mixture 70, which is capable of setting a chain reaction of the crosslinkable group in motion. Crosslinking may proceed thermally or optically during or after phase separation, i.e. during or after heat treatment. In the first case, formation of the mesoscopic boundary layer may be purposefully controlled, wherein complete phase separation does not take place, since the phase separation process is so to speak "frozen" by the viscosity of the component to be crosslinked, which increases during crosslinking. In the second case, i.e. in the case of crosslinking after phase separation, the structure obtained is "frozen" and likewise no longer changes during operation of the organic light-emitting device.

FIG. 3 shows a further exemplary embodiment in which the scattering layer 7 comprises a third component 76 in the form of scattering particles, in addition to the first organic component 71 and the second organic component 72. In the exemplary embodiment shown, the third component 76 is hydrophilic and thus mixes preferentially with the second organic component 72, for which reason, as a result of the phase separation process as described in association with FIG. 2B, the third component 76 arranges itself mainly in the second sublayer 74. The scattering particles of the third component 76 have a refractive index which differs from the refractive index of the second organic component 72.

A further exemplary embodiment is shown in association with FIG. 4, in which the first and the second organic components 71, 72 form constituents of block copolymers with different refractive indices. In the exemplary embodiment shown, the first and second organic components form block copolymers with the basic structure A-B. Furthermore, in the exemplary embodiment shown, the block copolymers each comprise an anchor group 77, which has a specific reactivity or polarity corresponding to the polarity of the carrier layer 6. Sulfides or carboxylates are examples of suitable reactive anchor groups 77. In accordance with the pretreatment or embodiment of the carrier layer 6, the block copolymers orient themselves after application of the mixture on the carrier layer 6, wherein the anchor groups 77 orient themselves towards the carrier layer 6 and the ends of the block copolymers opposite the anchor groups 77 are oriented towards the surface of the layer formed from the mixture 70. By the partially unordered arrangement of the block copolymers, as indicated in FIG. 4, a scattering layer is likewise formed with a mesoscopic boundary layer which likewise results in boundary surface scattering.

As an alternative to the exemplary embodiment shown, block copolymers with the first and second organic components 71, 72 may also be used which have a different basic structure from the basic structure described here, for example one of the basic structures described above in the general part of the description. In particular, the block copolymers, as described in the general part of the description, may also form mesophases which may result in subsurface scattering.

The block copolymers may furthermore comprise crosslinkable groups, as described previously.

In contrast to the previous exemplary embodiments in FIGS. 2A to 4, FIG. 5 shows an exemplary embodiment of a scattering layer 7 which, instead of a mesoscopic boundary layer, comprises a mesophase 78 or is formed by a mesophase of the first and second organic components 71, 72. To this end, the first and second organic components 71, 72 are intermixed without solvent and for example by ultrasonication to form a mixture 70 and exposed to an elevated temperature above the glass transition temperature of the mixture 70. The mixing process is here performed in such a way that only partial, not complete intermixing of the first and second components 71, 72 is achieved. In particular, the heat treatment is preferably terminated before intermixing of the first and second components 71, 72 is complete by cooling the mixture 70 to below the glass transition temperature. The heat treatment may here be terminated before or after application of the mixture 70 to the carrier layer 6.

The first and second organic components 71, 72 mix, so forming droplets at least of the first organic component 71 in the second organic component 72 and/or vice versa. In the exemplary embodiment shown, the second component 72 is added to the mixture 70 in a larger quantity than the first organic component 71, such that the first organic component 71 preferably forms droplets in the second organic component 72. Furthermore, droplet formation in both components 71, 72 may also occur, in particular in a mixture of the first and second organic components 71, 72 in which the two organic components 71, 72 are present at least locally in approximately the same quantity. In this way, the mixture 70 and the scattering layer 7 formed therefrom are present in a mesophase, in which the droplets form scattering centres for subsurface scattering.

The droplets preferably have a size greater than or equal to 200 nm and less than or equal to 10 µm.

Furthermore, it is also possible for the carrier layer 6 to be ambipolar and, as in the exemplary embodiment of FIGS. 2A to 2C, to apply a mixture 70 in which the first and second organic components 71, 72 are present in solution. After application of the mixture 70 to the carrier layer 6 and the heat treatment, spontaneous segregation of the first and second components 71, 72 may occur, which likewise leads to droplet formation and thus to formation of a mesophase.

The first and second organic components described in the previous and following exemplary embodiments may in particular comprise materials according to the embodiments described above in the general part of the description.

The scattering layers disclosed in the exemplary embodiments may moreover also comprise at least one UV-absorptive additive, whereby the organic layers of the organic functional layer stack 4 are protected from UV radiation. The additive may for example comprise titanium dioxide or an organic UV radiation absorbing material, for example one or more of the materials 2-hydroxybenzophenone, 2-hydroxyphenylbenzotriazole, salicylic acid esters, cinnamic acid ester derivative, resorcinol monobenzoate, oxalic acid anilide or p-hydroxybenzoic acid esters.

FIGS. 6 to 8 show further exemplary embodiments of organic light-emitting devices 101, 102 and 103, which constitute modifications of the organic light-emitting device 100 shown in FIG. 1 and which comprise a scattering layer 7 which may be produced according to one of the above-stated exemplary embodiments.

The light-emitting device 101 according to the exemplary embodiment of FIG. 6 comprises the scattering layer 7 on the first electrode 2 configured as a carrier layer 6.

To this end, the first electrode 2, which preferably comprises ITO or consists of ITO, is pretreated at the surface and is for example hydrophilic or hydrophobic. Like the organic light-emitting device 100, the organic light-emitting device 101 takes the form of a "bottom emitter".

In contrast, the organic light-emitting device 102 according to the exemplary embodiment of FIG. 7 takes the form of a "top emitter" and comprises the scattering layer 7 on the transparent second electrode 3 configured as carrier layer 6.

The organic light-emitting device 103 according to the exemplary embodiment in FIG. 8 comprises the scattering layer 7 within the organic functional layer stack 4. In particular, an organic functional layer of the organic functional layer stack 4 here takes the form of a carrier layer 6, on which the scattering layer 7 is arranged.

Due to the arrangement of the scattering layer 7 in the exemplary embodiments according to FIG. 1 and FIG. 7, the scattering layer 7 may in these cases be of electrically insulating or electrically conductive construction. In the exemplary embodiments according to FIGS. 6 and 8 with the scattering layer 7 between the first and second electrodes 2, 3, the scattering layer 7, i.e. at least one of the first and second organic components and particularly preferably both organic components, is of electrically conductive construction.

In addition to the exemplary embodiments shown, more than one scattering layer may also be present in an organic light-emitting device according to further exemplary embodiments. In particular, an organic light-emitting device according to further exemplary embodiments may also be configured to be bilaterally emitting and thus comprise at least one scattering layer on either side of the organic light-emitting layer 5. Furthermore, the exemplary embodiments shown comprise further or alternative features according to the embodiments in the general part of the description.

The description made with reference to the exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. Organic light-emitting device with
   a functional layer stack, which comprises a substrate, a first electrode thereabove, an organic functional layer stack thereabove with an organic light-emitting layer and a second electrode thereabove,
   wherein one layer of the functional layer stack forms a carrier layer for a scattering layer,
   wherein the scattering layer comprises at least one first and one second organic component with different refractive indices,
   wherein the first organic component is hydrophobic and the second organic component is hydrophilic,
   wherein the glass transition temperature of a mixture of the first organic component and the second organic component is above room temperature and
   wherein the first organic component and the second organic component are present in partially segregated form in the scattering layer and the scattering layer comprises a mesoscopic boundary layer between the first and second organic components or the scattering layer is present as a mesophase with the first and second organic components.

2. Device according to claim 1, wherein the refractive index difference of the first and second organic components is greater than 0.05.

3. Device according to claim 1, wherein the first and second organic components are present in two sublayers, in which in each case one of the first and second organic components is predominantly present and between which the mesoscopic boundary layer is formed.

4. Device according to claim 3, wherein the organic component predominantly present in the sublayer remote from the carrier layer is directly adjacent to a layer of the functional layer stack and has a refractive index which is the same as the refractive index of the directly adjacent layer.

5. Device according to claim 3, wherein the mesoscopic boundary layer has a thickness greater than or equal to 0.5 μm and less than or equal to 100 μm.

6. Device according to claim 1, wherein the first and second organic components form a block copolymer.

7. Device according to claim 6, wherein the block copolymer is arranged with an anchor group on the carrier layer.

8. Device according to claim 1, wherein the scattering layer is formed as a mesophase and at least one of the first organic component and second organic component is present in the mesophase in the form of droplets of a size greater than or equal to 200 nm and less than or equal to 10 μm.

9. Device according to claim 1, wherein the scattering layer comprises a third component in the form of scattering particles, which are hydrophobic and have a refractive index different from the first organic component or which are hydrophilic and have a refractive index different from the second organic component.

10. Device according to claim 1, wherein the scattering layer comprises at least one UV-absorptive additive.

11. Device according to claim 1, wherein at least one of the first and second organic components comprises a crosslinkable group, in particular selected from an epoxide, oxetane and acrylate.

12. Device according to claim 1, wherein the carrier layer is formed by the substrate, the first electrode or the second electrode.

13. Device according to claim 1, wherein the carrier layer is formed by a layer of the organic functional layer stack.

14. Method for producing an organic light-emitting device according to claim 1, in which
the first and second organic components are provided in a mixture in the form of a solution with an ambipolar solvent,
the mixture is applied to the carrier layer and exposed to heat treatment at an elevated temperature above a glass transition temperature of the mixture, such that the first and second components at least partially segregate, and
the heat treatment is terminated before ordering of the first and second components is complete by cooling to below the glass transition temperature, such that the scattering layer is formed with a mesoscopic boundary layer between the first and second organic components.

15. Method for producing an organic light-emitting device according to claim 1, in which
the first and second organic components are partially intermixed to form a partial mixture and exposed to a heat treatment at an elevated temperature above a glass transition temperature of the mixture,
the partial mixture is applied to the carrier layer and
the heat treatment is terminated by cooling to below the glass transition temperature before intermixing of the first and second components is complete, such that the scattering layer is present as a mesophase with the first and second organic components.

* * * * *